US010170682B2

(12) United States Patent
Alexander et al.

(10) Patent No.: US 10,170,682 B2
(45) Date of Patent: Jan. 1, 2019

(54) DIELECTRIC ELASTOMER ACTUATOR

(71) Applicants: GM GLOBAL TECHNOLOGY OPERATIONS LLC, Detroit, MI (US); The Regents of the University of Michigan, Ann Arbor, MI (US)

(72) Inventors: Paul W. Alexander, Ypsilanti, MI (US); Nancy L. Johnson, Northville, MI (US); Tizoc Cruz Gonzalez, Ann Arbor, MI (US); Jonathan E. Luntz, Ann Arbor, MI (US); Diann Brei, Milford, MI (US)

(73) Assignees: The Regents of the University of Michigan, Ann Arbor, MI (US); GM Global Technology Operations LLC, Detroit, MI (US)

(*) Notice: Subject to any disclaimer, the term of this patent is extended or adjusted under 35 U.S.C. 154(b) by 419 days.

(21) Appl. No.: 15/061,575

(22) Filed: Mar. 4, 2016

(65) Prior Publication Data

US 2016/0260888 A1 Sep. 8, 2016

Related U.S. Application Data

(60) Provisional application No. 62/129,473, filed on Mar. 6, 2015.

(51) Int. Cl.
*H01L 41/047* (2006.01)
*H01L 41/053* (2006.01)
(Continued)

(52) U.S. Cl.
CPC ...... *H01L 41/0475* (2013.01); *H01L 41/0536* (2013.01); *H01L 41/0986* (2013.01); *H01L 41/25* (2013.01); *H01L 41/0478* (2013.01)

(58) Field of Classification Search
CPC . H01L 41/0475; H01L 41/0536; H01L 41/09; H01L 41/0973; H01L 41/1138; H01L 41/083; H01L 41/0815
See application file for complete search history.

(56) References Cited

U.S. PATENT DOCUMENTS 7,362,889 B2* 4/2008 Dubowsky ............. G01R 33/28
382/128
7,594,359 B2* 9/2009 Keefe .................... F16J 15/064
49/475.1
(Continued)

*Primary Examiner* — Edgardo San Martin
(74) *Attorney, Agent, or Firm* — Quinn IP Law

(57) ABSTRACT

A dielectric elastomer actuator includes an elastomeric film and an electrode material layer on opposing sides of the film. The elastomeric film includes a first section, a second section, and a transition section disposed between the first section and the second section. The electrode material layers are disposed on the transition section and the first and second sections. The first and second sections are restrained in a pre-stretched configuration in an axial and a lateral direction, while the transition section is not restrained in the axial direction. The transition section elongates in response to the application of a voltage to the electrode material layers, such that the first and second sections move apart, in the axial direction. Likewise, the transition section is configured to contract in an absence of a voltage applied to the electrode material layers, such that the first and second sections move apart, in the axial direction.

15 Claims, 4 Drawing Sheets

(51) Int. Cl.
*H01L 41/09* (2006.01)
*H01L 41/25* (2013.01)
*H01L 41/04* (2006.01)

(56) References Cited

U.S. PATENT DOCUMENTS

| | | | | |
|---|---|---|---|---|
| 7,669,918 B2 * | 3/2010 | Buravalla | .............. | B62D 21/15 |
| | | | | 296/187.03 |
| 8,240,677 B2 * | 8/2012 | Browne | ................... | B60J 10/50 |
| | | | | 277/628 |
| 8,789,314 B2 * | 7/2014 | Alexander | ............. | B60J 10/244 |
| | | | | 49/475.1 |
| RE45,464 E * | 4/2015 | Kornbluh | ............... | A63H 13/00 |
| | | | | 310/311 |
| 9,876,160 B2 * | 1/2018 | Biggs | .................... | H01L 41/047 |
| 2010/0308592 A1 * | 12/2010 | Frayne | ................... | H02N 2/185 |
| | | | | 290/54 |
| 2011/0155307 A1 * | 6/2011 | Pelrine | .................... | F02G 1/043 |
| | | | | 156/229 |
| 2016/0025669 A1 * | 1/2016 | Sun | ........................ | H01G 9/022 |
| | | | | 205/790.5 |
| 2016/0027995 A1 * | 1/2016 | Wagner | ................... | H01L 41/27 |
| | | | | 310/300 |
| 2016/0131275 A1 * | 5/2016 | Rodegheri | ................ | F16K 7/14 |
| | | | | 251/129.06 |
| 2018/0053386 A1 * | 2/2018 | Ebrahimi Takalloo | .. | G08B 6/00 |

* cited by examiner

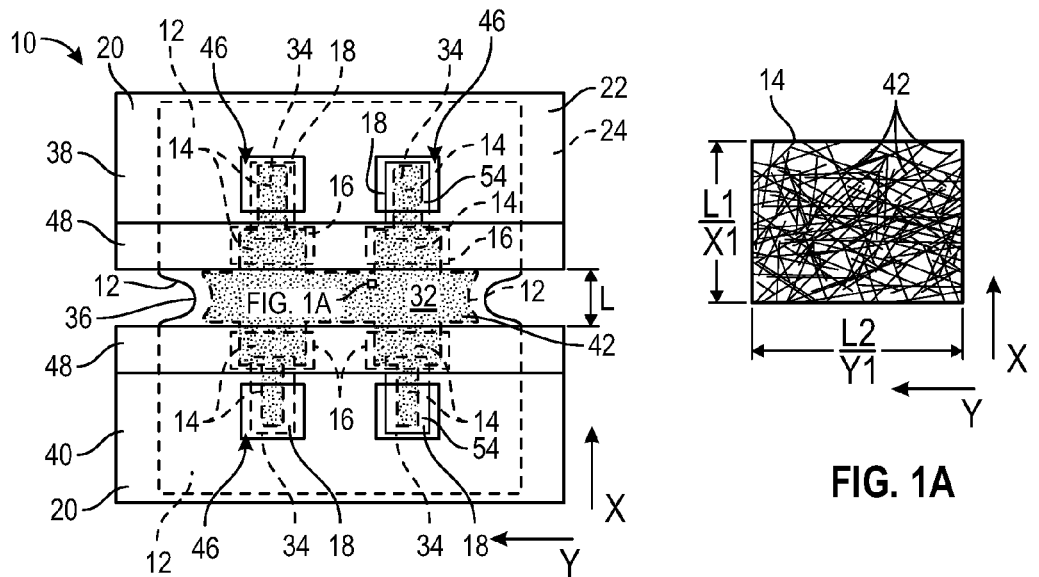
FIG. 1
FIG. 1A
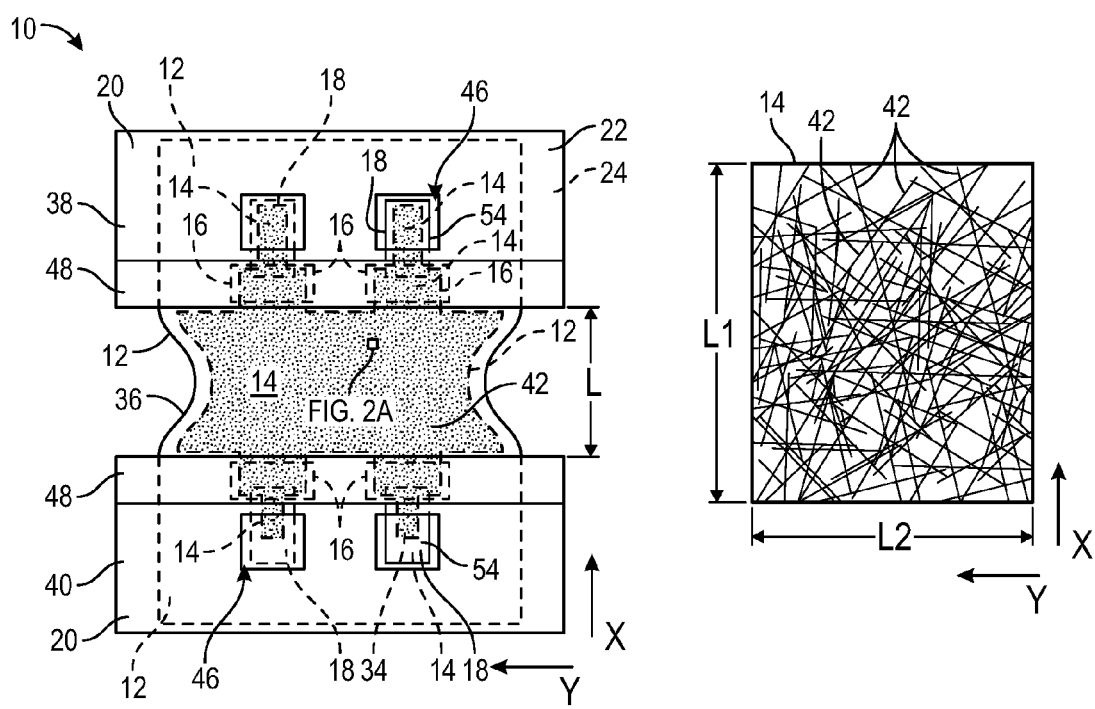
FIG. 2
FIG. 2A

DIELECTRIC ELASTOMER ACTUATOR

CROSS-REFERENCE TO RELATED APPLICATIONS

This application claims the benefit of U.S. Provisional Application No. 62/129,473, filed Mar. 6, 2015, which is hereby incorporated by reference in its entirety.

TECHNICAL FIELD

The present disclosure generally relates to dielectric elastomer actuators.

BACKGROUND

Dielectric elastomers are smart material systems that produce large strains. Dielectric elastomer actuators (DEAs) transform electric energy into mechanical work. They are lightweight and have a high elastic energy density.

SUMMARY

One aspect of the disclosure provides a dielectric elastomer actuator (DEA) that includes an elastomeric film and an electrode material layer. The elastomeric film presents a first side and a second side, opposing the first side. The elastomeric film includes a first section, a second section, and a transition section disposed in an axial direction, between the first section and the second section. The electrode material layer is disposed on the transition section and at least one of the first section and the second section, on each of the first side and the second side. The electrode material layer is electrically conductive. The first section and the second section are restrained in a pre-stretched configuration in each of the axial direction and a lateral direction, perpendicular to the axial direction. The transition section is not restrained in a pre-stretched configuration in the axial direction. The transition section is configured to elongate in the axial direction in response to the application of a voltage to the electrode material layers, such that the first section and the second section move away from one another, in the axial direction. Likewise, the transition section is configured to contract in the axial direction in an absence of a voltage applied to the electrode material layers, such that the first section and the second section move toward one another, in the axial direction.

Another aspect of the disclosure provides a method of forming a dielectric elastomeric actuator. The method includes stretching an elastomeric film in an axial direction and a lateral direction, perpendicular to the axial direction, to achieve a pre-stretched configuration. An electrode material layer is applied to the first surface and the second surface of the elastomeric film, with the elastomeric film maintained in the pre-stretched configuration. Each of the electrode material layers is electrically conductive. An attachment material is applied to a first section and a second section of the elastomeric film, on at least one side. As such, the first section and the second section are restrained by the attachment material in the pre-stretched configuration, and a transition section, axially disposed between the first section and the second section, is not restrained by the attachment material in the axial direction. Stretching of the elastomeric film is discontinued, such that the transition section contracts to allow the first section and the second section to move toward one another in the axial direction.

In yet another aspect of the disclosure, an actuator is provided that includes a first DEA and a second DEA. The electrode material layers of each of the first and second DEA includes a movement area and at least one tab area. The movement area covers at least a portion of the transition section and the tab area extends from the movement area and covers a portion of at least one of the first section and the second section. For each of the first and second DEA, the tab area on the first side is offset from the tab area on the second side. The one tab area of the first DEA is in electrical contact relationship with one tab area of the second DEA, such that the first and second DEA are electrically connected to one another. This electrical connection may be in series or in parallel.

While a single DEA provides a length of travel in response to the application of a voltage to the electrode material layer, electrically connecting multiple DEAs to one another in series results in an increase in a total distance of travel between opposing sections of the actuator, while connecting multiple DEAs to one another in parallel results in an increased force to be applied by the opposing sections of the actuator. The DEAs may be formed from compliant flexible materials, such that the DEAs may be attached to objects that are nonplanar.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIG. 1 is a schematic plan view of a dielectric elastomer actuator (DEA) in a retracted position.

FIG. 1A is an enlargement of "FIG. 1A", as provided in FIG. 1.

FIG. 2 is a schematic plan view of the DEA in an extended position.

FIG. 2A is an enlargement of "FIG. 2A", as provided in FIG. 2.

DETAILED DESCRIPTION

Figure 3:
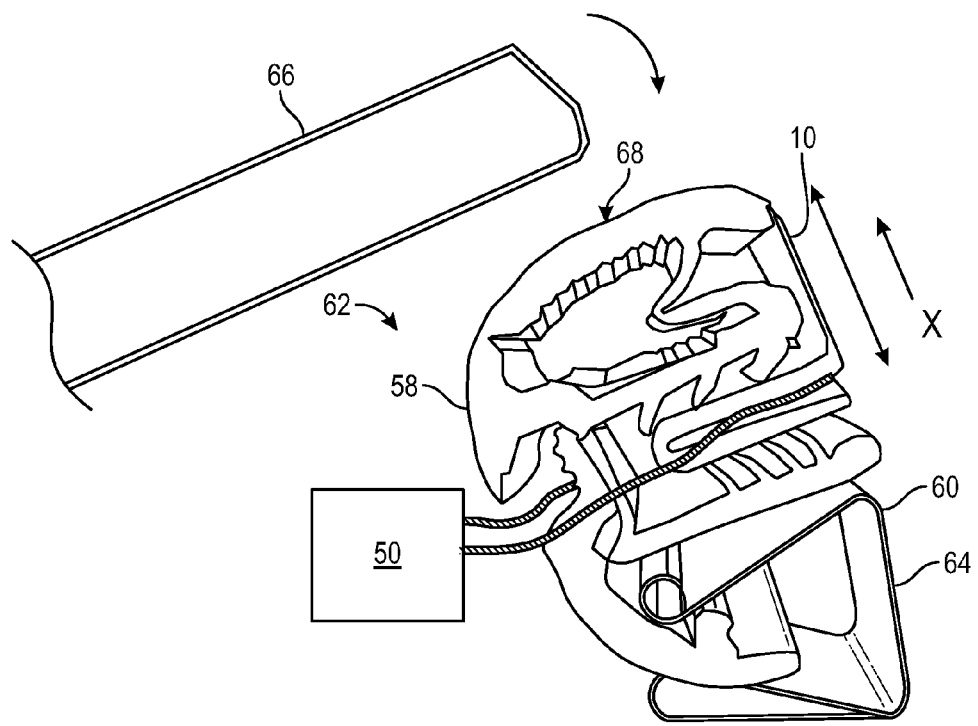
FIG. 3 is a schematic perspective cross-sectional end view of a seal attached to a flange of a door opening of a vehicle, with the door in an open position and with the DEA attached to the seal.
Figure 4:
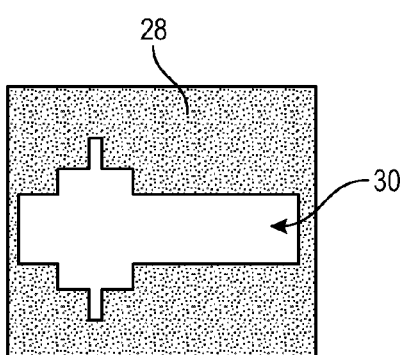
FIG. 4 is a schematic plan view of a mask configured to apply electrode material to an elastomeric film when assembling the DEA.

Referring to the drawings, wherein like reference numbers refer to like components throughout the several Figures, a dielectric elastomer actuator (DEA 10) is shown schematically in FIG. 1. In operation, the DEA 10 extends linearly or otherwise expands, in response to the application of a voltage v. Likewise, the DEA 10 retracts linearly, in an axial direction X, in response to the absence of a voltage v.

The DEA 10 is configured to be flexible and compliant, such that the DEA 10 may be attached to surfaces of objects having any desired shape. By way of a non-limiting example, FIG. 3 illustrates the DEA 10 being operatively attached to a door seal 58 of a vehicle 64. More specifically, FIG. 3 is a schematic cross-sectional view of a door seal 58, mounted to a flange 60 of a door opening 62 for a vehicle 64. The vehicle 64 may include a motorized vehicle, such as, but not limited to, standard passenger cars, sport utility vehicles, light trucks, heavy duty vehicles, minivans, buses, transit vehicles, bicycles, robots, farm implements, sports-related equipment or any other transportation device. FIG. 3 also illustrates a door 66 in spaced relationship to the door seal 58. The DEA 10 is operatively attached to the door seal 58, in generally perpendicular relationship to a contact surface 68 for the door 66. Upon closure of the door 66, relative to the door opening 62, the door 66 contacts the contact surface 68 of the door seal 58, compressing or otherwise collapsing the door seal 58. In this non-limiting example, the DEA 10 may be configured to be deactivated when the door 66 is in an open position (i.e., not in contact with the door seal 58), such that the door seal 58 relaxes. Therefore, upon closing the door 66, the door 66 does not have to collapse the relaxed door seal 58, resulting in a lower effort to close the door 66. Then, upon closure of the door 66, the voltage v is applied to the DEA 10, and the DEA 10 may become activated to extend a length L, such that the door seal 58 seals against the door 66.

It should be appreciated that the DEA 10 is not limited to being used as an actuator for door seals 58 of a vehicle 64, but may be used alone, or in combination, in any other desired application. The DEAs 10 may be used, for example, with seals for other closure panels, pressure relief valves, robotics, artificial muscles, power generation, pumps, energy harvesting, sensors, and the like.

Referring again to FIG. 1, the DEA 10 includes an elastomeric film 12, an electrode material 14, an electrically conductive material 16, a conductive strip 18, and an attachment material 20 to provide a tape-like structure, as will be explained in more detail below. The elastomeric film 12 presents a first side 22 and a second side 24, opposing the first side 22. The elastomeric film 12 is resilient, stretchable, and capable of high strains.

The elastomeric film 12 can be made from many elastomeric materials such as, for example, polymeric organosilicon compounds, acrylic (e.g., 3M® VHB 4910), latex (e.g., natural latex), and/or other like elastomeric materials. In one non-limiting example, the elastomeric film 12 may include a silicon-based organic polymer, such that the elastomeric film 12 may be a silicone film. The silicone film provides the desired level of resilience, temperature independence, and strain. More specifically, the silicone film may maintain a desired amount of elasticity, over a wide temperature range. One type of silicone film may be formed from polydimethylsiloxane (e.g., Wacker Silpuran® 6000/10) in a solvent, such as, for example, an isoparaffinic solvent (e.g., Exxon-Mobil® Chemical Isopar® G), to provide a liquid silicone rubber solution. The polydimethylsiloxane (PDMS) may be selected to ultimately provide an elastomeric film 12 with a desired stiffness.

The liquid silicone rubber solution may be applied, e.g., via drop casting and the like, to a surface of a template, and subsequently cured. It should be appreciated that the amount of solvent used, determines the viscosity of the liquid silicone rubber solution, for purposes of application to the template to allow the liquid silicone rubber mixture solution to spread evenly across the surface of the template. The template may have a rectangle or square shape. In one non-limiting example, the template may be a glass plate, such as a precision-flat glass plate that is leveled. Levelling the surface of the plate allows the liquid silicone rubber solution to level out evenly, due to gravity, before curing, to provide an elastomeric film 12 having a generally consistent thickness.

In one non-limiting embodiment, the liquid silicone rubber solution may be cured in a vacuum oven for 120 minutes at 170° C. The vacuum oven may pull any dissolved gasses from the liquid silicone rubber solution to eliminate the possibility of bubbles within the elastomeric film 12, as the liquid silicone rubber solution cures. Additionally, prior to, or during, curing, the solvent evaporates, leaving only the elastomeric materials to form the elastomeric film 12. It should be appreciated that other methods of curing, cure time, and/or temperature may be used.

Figure 5:
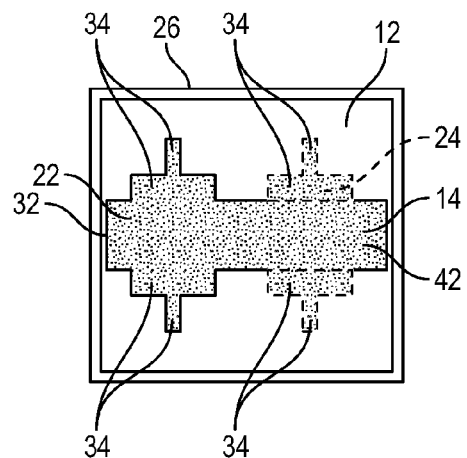
FIG. 5 is a schematic plan view of the elastomeric film stretched across a frame in an axial direction and a transverse direction, with electrode material applied to a first side of the film and a second side of the film, opposite the first side.
Figure 6A:
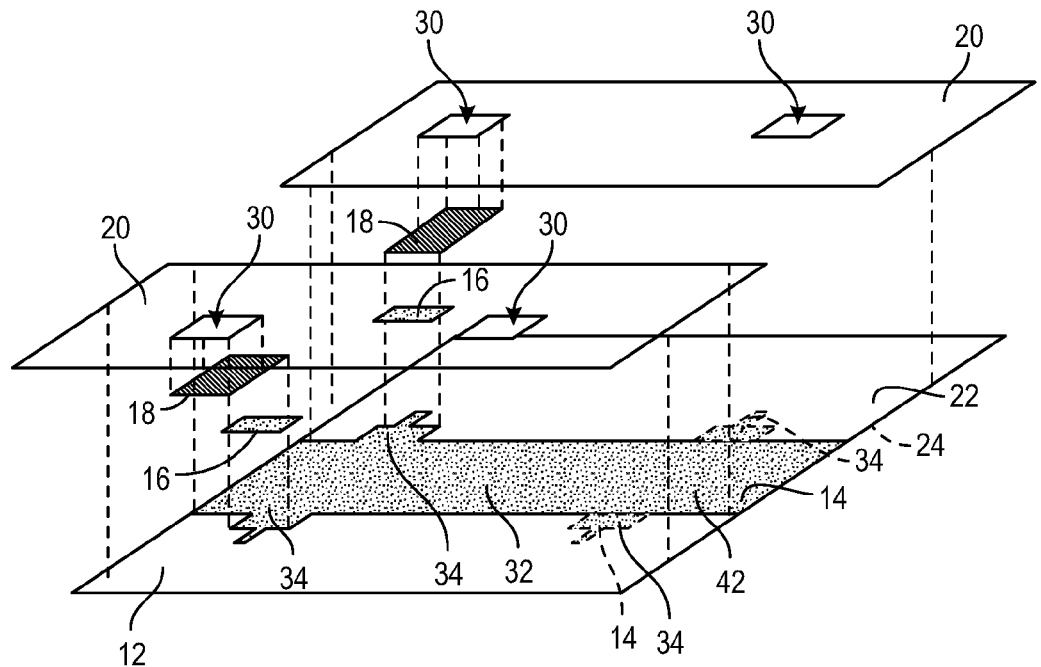
FIG. 6A is a schematic exploded perspective side view of electrically conductive material, conductive strips, and attachment material being applied to the first side of the elastomeric film and the respective electrode material layer.
Figure 6B:
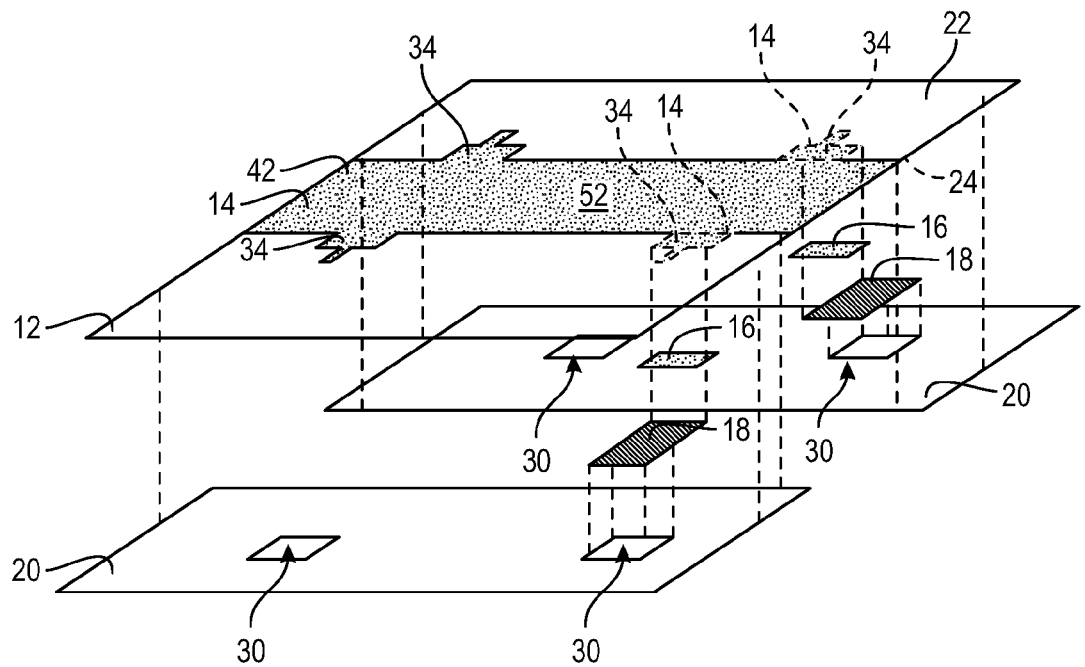
FIG. 6B is a schematic exploded perspective side view of electrically conductive material, conductive strips, and attachment material being applied to the second side of the elastomeric film and the respective electrode material layer.

Once cured, the elastomeric film 12 may be removed from the surface of the template and applied to a frame 26 in a pre-stretched configuration, as illustrated in FIG. 5. More specifically, the elastomeric film 12 is stretched across the frame 26 in an axial direction X and stretched in a lateral direction Y, perpendicular to the axial direction X. In one non-limiting example, with reference to FIG. 2A, the elastomeric film 12 is pre-stretched to provide an axial length L1 in the axial direction X and a lateral length L2 in the lateral direction Y. As stretched, the elastomeric film 12 may have a 100% elongation X1 in the axial direction (i.e., 2 times a length of the as-cast elastomeric film 12) and is pre-stretched to 150% elongation Y1 in the lateral direction (i.e., 2.5 times a width of the as-cast elastomeric film 12). It should be appreciated that other amounts of pre-stretched elongation X1, Y1 may be applied to the elastomeric film 12 so as to provide the desired actuation, in the axial direction X, as described in more detail below.

Once the elastomeric film 12 is applied to the frame 26 in the pre-stretched configuration, a mask 28 (illustrated in FIG. 4) may be placed over the first side 22 and over the second side 24 (illustrated in FIG. 5). The mask 28 defines an opening 30 that presents a pattern. As such, each mask 28 functions as a stencil to guide where the electrode material 14 is applied to the respective surface. Therefore, once the mask 28 is placed over the respective sides 22, 24, the electrode material 14 is applied to the surfaces 22, 24, as defined by the respective mask 28, to form an electrode material layer 14. Once applied, the electrode material layer 14 may include a movement area 32 and at least one tab area 34. The movement area 32 covers a transition section 36 of the elastomeric film 12, disposed between a first section 38 and a second section 40. The tab area 34 extends from the movement area 32 and covers a portion of at least one of the first and second sections 38, 40 of the elastomeric film 12. Referring to FIGS. 4, 5, 6A, 6B, it should be appreciated that the electrode material layer 14 may not be applied as a pattern that is a mirror image between the sides 22, 24. As illustrated, the tab areas 34 on the first side 22 are offset from the tab areas 34 of the second side 24.

The electrode material layer 14 may include a mixture of single wall carbon nanotubes (SWNT 42) and a solvent. In one non-limiting example, the solvent is isopropanol. It should be appreciated that other solvents may also be used. In one non-limiting example, the SWNT 42 and isopropanol may be combined in a ratio of 0.4 milligrams (mg) of SWNT 42 to one milliliter (mL) of isopropanol. The electrode material 14 may be applied to the surfaces of the elastomeric film 12 via spraying, such as with an airbrush. It should be appreciated that the electrode material 14 may be applied to the surfaces using any other application method, as known to those skilled in the art.

Once applied, the SWNT 42 of the electrode material layer 14 may have a density ranging from about 0.1 micrograms ($\mu g$) per square centimeter ($cm^2$) to about 10,000 $\mu g/cm^2$, with the elastomeric film 12 in the pre-stretched configuration, as illustrated in FIG. 2A. The lower density may be limited by the conductivity of the electrodes. The larger density of 10,000 $\mu g/cm^2$ may provide stiff electrodes for applications such as energy harvesting, sensors, and the like. Pre-stretching the elastomeric film 12 in the axial direction X ensures that when the electrodes are applied to the elastomeric film 12 at a "fully-actuated length", at a density that is sufficient to provide electrical conductivity when the elastomeric film 12 is considered to be at least equal to a length the elastomeric film 12 will stretch when the DEA 10 is actuated, the electrodes (i.e, SWNT 42) do not lose electrical conductivity. Further, application of the electrodes to the elastomeric film 12 in the pre-stretched configuration (FIG. 2A) may help to ensure that less electrode material 14 is used, while still maintaining the electrical conductivity. Using less electrode material 14 may provide improved actuation performance, since the electrodes can have a significant stiffness and the electric field must also work against the stiffness, during actuation, when the elastomeric film 12 is in an unstretched configuration (FIG. 1A), which may reduce the performance of the DEA 10.

With the elastomeric film 12 still in the pre-stretched configuration, a plurality of pieces of electrically conductive material 16 may be disposed over portions of the tab area 34 of the electrode material layer 14 (adjacent the transition section 36). More specifically, each piece of electrically conductive material 16 is disposed over a respective portion of the first and second sections 38, 40. As illustrated in FIGS. 1 and 2, the first and second sections 38, 40 of each side 22, 24 are disposed in axially spaced relationship to one another, with the transition section 36 axially disposed therebetween. As will be described in more detail below, the first and second sections 38, 40 are configured to axially move apart from one another (i.e., from FIG. 1 to FIG. 2). Due to the proximity of the electrically conductive material 16 to the transition section 36 of the electrode material layer 14, the electrically conductive material 16 may be selected to match the compliance of the elastomeric film 12, so as to not restrain movement of the SWNT 42 of the electrode material layer 14 at the adjacent transitional area, during actuation of the DEA 10. Further, the electrically conductive material 16 is also selected to be electrically conductive so as to conduct current through the respective electrode material layer 14. In one non-limiting example, the electrically conductive material 16 is a fabric adhesive tape material. Such a fabric adhesive tape material may be formed from a conductive, non-woven fabric that includes an electrically conductive pressure-sensitive acrylic adhesive. An example of such a fabric adhesive tape material is a 3M® Fabric Tape CN-4490. The 3M® Fabric Tape CN-4490 provides electrical conductivity from the elastomeric film 12, through the adhesive to the conductive backing, while also providing flexibility and conformability. It should be appreciated that other electrically conductive materials 16 may also be used, so long as the desired flexibility and electrical conductivity of the materials are achieved.

Again, with the elastomeric film 12 still in the pre-stretched configuration, a plurality of conductive strips 18 may be disposed over portions of the respective tab area 34 of the electrode material layer 14 and portions of the respective first or second side 22, 24 of the elastomeric film 12. More specifically, each conductive strip 18 is disposed over another portion of a respective first section 38 and second section 40 of each of the first and second sides 22, 24. Alternatively, the conductive strip 18 is not disposed over portions of the respective tab area 34. Each conductive strip 18 may be disposed proximate, or in overlapping relationship with, the respective piece of electrically conductive material 16, such that each piece of electrically conductive material 16 is disposed between the transition section 36 and the respective conductive strip 18. The conductive strips 18 are configured to more efficiently transfer the voltage to the SWNT 42, as opposed to applying the voltage v directly to the SWNT 42. Further, as will be explained in more detail below, each conductive strip 18 may be a double-sided adhesive conductive tape. By way of one non-limiting example, the conductive strips 18 may be 3M® XYZ Electrically Conductive Adhesive Transfer Tape 9719 for LSE Substrates and High Temperature Applications. Additionally, in another non-limiting embodiment, the conductive strip 18 may be connected directly to the tab area 34, such that the electrically conductive material 16 is not required.

Pre-stretching in the lateral direction Y, as described above, influences the properties of the final DEA 10. More specifically, the lateral pre-stretch and the axial pre-stretch are held in place across the first and second sections 38, 40 by an attachment material 20. The attachment material 20 may adhere to, or otherwise bond to, the surface of the elastomeric film 12, the electrically conductive material 16, conductive strips 18, and the like. The attachment material 20 may be applied to the first and/or second sides 24 of the elastomeric film 12. Where the elastomeric film 12 is pre-stretched in the axial and lateral directions X, Y, the elastomeric film 12 becomes thinner. By way of one non-limiting example, the elastomeric film 12 may be formed to about 100 to 125 microns. When the elastomeric film 12 is pre-stretched in the axial and lateral direction X, Y, the material may be about 20 microns or less. The thickness of the elastomeric film 12 influences a required voltage to operate the DEA 10.

The attachment material 20 maintains the reduced thickness of the elastomeric film 12 across each of the first and second sections 38, 40. The transition section 36 is not covered by the attachment material 20. Further, the lateral pre-stretch orients the polymer chains, which changes the material properties, both electrically (in terms of breakdown voltage and possible dielectric constants) and mechanically (a stiffness profile is changed in the axial direction X).

The attachment material 20 is configured to resist tension once the elastomeric film 12 is released from the frame 26. Further, the attachment material 20 is configured to similarly resist strain. As such, the attachment material 20 essentially "sets" the dimensions of the underlying elastomeric film 12. However, in the transition section 36, axially defined between the first and second sections 38, 40, the elastomeric film 12 is not covered by the non-conductive tape. Therefore, once the elastomeric film 12 is released from the frame 26, the pre-stretched elastomeric film 12 does contract in the axial direction X, such that the first and second sections 38, 40 contract toward one another in the axial direction X. Likewise, due to the restraint of the elastomeric film 12 in the lateral direction Y for each of the first and second sections 38, 40, opposing ends of the transition section 36, i.e., in the lateral direction, retract toward one another such that a generally concave recess is defined by each of the opposing ends. Therefore, the transition section 36 is partially restrained in a pre-stretched configuration in the lateral direction Y as a function of the restraint of the first and second sections 38, 40 in the pre-stretched configuration. Therefore, the transition section 36 is generally restrained in the pre-stretched configuration in the lateral direction Y, since the transition section 36 is only restrained where directly connected to the first and section sections 38, 40, such that the opposing ends of the transition section 36 are allowed to curve or relax toward one another.

The attachment material 20 may be non-conductive tape that is applied across each of the first and second sections 38, 40 of each side of the elastomeric film 12. The non-conductive tape may be an adhesive tape that is configured to adhere to, or otherwise to bond to, the surface of the elastomeric film 12, the electrically conductive material 16, the conductive strips 18, and the like. The non-conductive tape may define at least one hole 46. As such, when the non-conductive tape is applied across the respective section, the hole 46 prevents the non-conductive tape from completely covering at least one of the conductive strips 18. As such, the uncovered conductive strip 18 is electrically accessible for connection to a power source 50, as explained in more detail below.

The non-conductive tape may be Kapton® tape. More specifically, the non-conductive tape may be double-sided Kapton® tape. As such, an exposed side of the tape provides an adhesive layer 48, thus providing the DEA 10 with the ability to be adhered to other dielectric actuators and/or other devices or objects, as desired. Further, since Kapton® tape is flexible out-of-plane, the Kapton® tape may be attached to non-planar and flexible objects, for example, the seal 58

During operation, the DEA 10 is attached to a power source 50, such that a lead is attached to one of the conductive strips 18, i.e., at a positive location "+", and a ground is attached to another one of the conductive strips 18, i.e., at a negative location "−". Once the power source 50 is energized, voltage enters through the positive location to energize the electrode material 14. The SWNT 42, in combination with the elastomeric film 12, maintain the actuation strain performance of the elastomeric film 12 at relatively low electric fields, while increasing force output and work density, due to the additive effect of mechanical reinforcement and permittivity enhancement. Thus, electrostatic attraction between the opposite charges on the opposing electrodes (i.e., on opposite sides of the elastomeric film 12) and the repulsion of like charges on each electrode generate stress on the elastomeric film 12, causing the elastomeric film 12 (including the electrode material layer 14) to contract in thickness, thus expanding its area. Since the elastomeric film 12 is retained in the pre-stretched state in the lateral direction Y across each of the first and second section 38, 40, the elastomeric film 12 of the transition section 36 expands its area primarily in the axial direction X (from FIG. 2A to FIG. 2B). As such, upon the application of a voltage to a single DEA 10, the first and second sections 38, 40 move apart from one another a length L, in the axial direction X. An external biasing force in the axial direction X is generally present, stretching the transition section 36 the length L. When the voltage is applied, the transition section 36 gets thinner and, therefore, more compliant (essentially relaxing), allowing the external force to stretch the transition section 36 further, producing motion. When the voltage is removed, the DEA 10 contracts, pulling against the external force, until the original length L is achieved.

Figure 7:
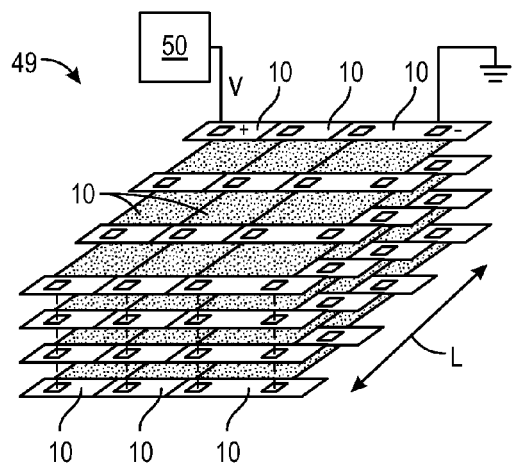
FIG. 7 is a schematic exploded perspective end view of a plurality of parallel, stacked DEAs.

Each DEA 10 may be actuated as a single unit to provide linear movement in the axial direction X. However, a plurality of DEAs 10 may be operatively connected to one another in parallel and/or in series. By way of a non-limiting example, parallel, stacked DEAs 10 are illustrated at 49 in FIG. 7. The arrangement schematically illustrated in FIG. 7 provides for the multiplication of the force that would otherwise be provided by a single DEA 10, over the same length L. Thus, parallel, stacked DEAs 10 provide increased force over a single DEA 10, while providing the same length L of travel as a single DEA 10.

Figure 8:
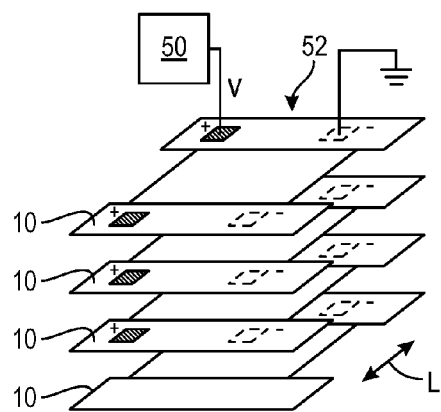
FIG. 8 is a schematic exploded perspective end view of a plurality of DEAs stacked in parallel and arranged in series.

By way of another non-limiting example, FIG. 8 schematically illustrates a plurality of DEAs 10, arranged as a series and parallel sheet actuator 52. In this arrangement, not only is the force of a single DEA 10 multiplied by the number of DEAs 10 stacked and by the number of DEAs 10 arranged side-by-side in parallel, but the length of travel is also multiplied by the number of DEAs 10 arranged in series. Although not illustrated, it should be appreciated that the DEAs 10 may also be arranged in series to provide an increased length of travel, without a magnification of force.

Further, as discussed above, the conductive strips 18 may have a double-sided adhesive strip 54. As such, not only does this allow the conductive strips 18 to be attached to the elastomeric film 12, but this allows an exposed conductive strip 18 of one DEA 10 to be adhered to an exposed conductive strip 18 of another DEA 10, to the power source 50, ground, and the like. The ability to adhere the exposed adhesive strip 54 to the exposed adhesive strip 54 of another DEA 10 allow for a plurality of DEAs 10 to be quickly and easily attached to one another in any desired electrical configuration, i.e., series and/or parallel. The entire DEA 10 is flexible out-of-plane, such that the DEA 10 can be bent or wrapped around flexible objects of different shapes, such as the seal 58 explained above. Further, a backing to the conductive strip 18 may be selectively removed to expose the adhesive strip 54, when it is desired to use the respective conductive strip 18 as an electrical lead. Therefore, by way of a non-limiting example, with reference to FIGS. 1 and 2, while a single DEA 10 may be created that includes the potential to expose more than a single conductive strip 18 on the first side 22 and the second side 24, the possibility exists for the user to selectively uncover only those conductive strips 18 to be used when attaching a plurality of DEAs 10 to one another. Further, the connection of the conductive strips 18 may be configured to be selectively detached from the other conductive strip 18, power source 50, ground, and the like, to allow the DEAs 10 to be reused, in another application, or replaced, without having to replace every DEA 10 in a circuit.

Figure 9:
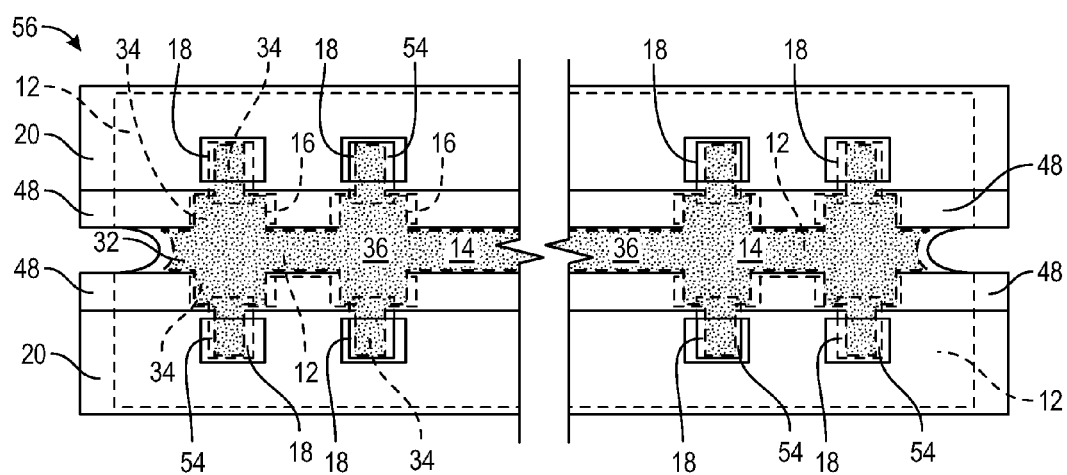
FIG. 9 is a schematic plan view illustrating a strip of DEA.

Referring now to FIG. 9, a DEA strip 56 is illustrated. In one embodiment, the strip 56 may be produced through a continuous forming operation. In the continuous forming operation, the elastomeric film 12 may be formed, cured, and pre-stretched as a process. The pre-stretched elastomeric film 12 is continuously fed though the operation, where the electrode material layers 14, electrically conductive materials 16, conductive strips 18, and attachment materials 20 are applied. As such, the electrode material layers 14 may be applied as continuous layers. Also, the attachment materials 20 may also be applied as continuous strips of attachment material 20. The combination of the electrically conductive materials 16 and the conductive strips 18 are applied in spaced intervals to one another, to provide conductive strips 18 and electrically conductive materials 16 at repeating spaced intervals to one another to provide the DEA strip 56. The resultant DEA strip 56 may be rolled up for storage and/or transportation. The strip of DEA 56 may be cut to any desired length.

While the best modes for carrying out the many aspects of the present teachings have been described in detail, those familiar with the art to which these teachings relate will recognize various alternative aspects for practicing the present teachings that are within the scope of the appended claims.

The invention claimed is:

1. A dielectric elastomer actuator (DEA) comprising:
   an elastomeric film presenting a first side and a second side, opposing the first side;
   wherein the elastomeric film includes a first section, a second section, and a transition section disposed in an axial direction, between the first section and the second section;
   an electrode material layer disposed on the transition section and at least one of the first section and the second section, on each of the first side and the second side, wherein the electrode material layer is electrically conductive;
   wherein the first section and the second section are restrained in a pre-stretched configuration in each of the axial direction and a lateral direction, perpendicular to the axial direction;
   wherein the transition section is not restrained in a pre-stretched configuration in the axial direction and is partially restrained in a pre-stretched configuration in the lateral direction as a function of the restraint of the first section and the second section in the pre-stretched configuration;
   wherein the transition section is configured to elongate in the axial direction in response to the application of a voltage to the electrode material layers, such that the first section and the second section move away from one another, in the axial direction; and
   wherein the transition section is configured to contract in the axial direction in an absence of a voltage applied to the electrode material layers, such that the first section and the second section move toward one another, in the axial direction.

2. The dielectric elastomer actuator, as set forth in claim 1, wherein the electrode material layer disposed on each of the first side and the second side includes a movement area and at least one tab area;
   wherein the movement area covers at least a portion of the transition section;
   wherein the at least one tab area extends from the movement area and covers a portion of at least one of the first section and the second section; and
   wherein the at least one tab area on the first side is offset from the at least one tab area on the second side.

3. The dielectric elastomer actuator, as set forth in claim 2, further comprising a plurality of pieces of electrically conductive material;
   wherein one of the plurality of pieces of electrically conductive material is disposed over at least a portion of a respective tab area disposed on the respective one of the first side and the second side;
   wherein each of the plurality of pieces of electrically conductive material is electrically conductive; and
   wherein each of the plurality of pieces of electrically conductive material is compliant.

4. The dielectric elastomer actuator, as set forth in claim 3, further comprising a plurality of conductive strips;
   wherein each of the plurality of pieces of conductive strips is electrically conductive.

5. The dielectric elastomer actuator, as set forth in claim 4, wherein each of the plurality of conductive strips is disposed in overlapping relationship with the respective one of the plurality of pieces of electrically conductive material.

6. The dielectric elastomer actuator, as set forth in claim 4, wherein each of the plurality of conductive strips is less compliant than each of the plurality of pieces of electrically conductive material.

7. The dielectric elastomer actuator, as set forth in claim 4, wherein at least one of the plurality of conductive strips presents an adhesive layer, facing opposite the respective tab area.

8. The dielectric elastomeric actuator, as set forth in claim 7, further comprising an attachment material attached to at least one of the first side and the second side of each of the first section and the second section of the elastomeric film, such that the attachment material restrains the respective one of the first section and the second section in the pre-stretched configuration in each of the axial direction and the lateral direction;
   wherein the attachment material defines at least one hole such that the at least one hole provides access to a corresponding portion of the adhesive layer of the respective adhesive strip to allow the dielectric elastomeric actuator to be selectively attached to, and detached from, another dielectric elastomeric actuator such that a mechanical connection and an electrical connection between the dielectric elastomeric actuators is achieved.

9. The dielectric elastomer actuator, as set forth in claim 2, further comprising a plurality of conductive strips;
   wherein one of the plurality of conductive strips is disposed over at least a portion of the respective tab area disposed on the respective one of the first side and the second side.

10. The dielectric elastomeric actuator, as set forth in claim 1, wherein the electrode material layer has a sufficient density when the elastomeric film is in the pre-stretched configuration, such that the electrode material layer is configured to provide continuous electrical conductivity as the transition section elongates and contracts.

11. The dielectric elastomeric actuator, as set forth in claim 1, further comprising an attachment material attached to at least one of the first side and the second side of each of the first section and the second section of the elastomeric film, such that the attachment material restrains the respective one of the first section and the second section in the pre-stretched configuration in each of the axial direction and the lateral direction;
   wherein the attachment material is compliant; and
   wherein the attachment material is non-conductive.

12. The dielectric elastomeric actuator, as set forth in claim 11, wherein the attachment material is presents an adhesive surface, opposite the elastomeric film;
   wherein the adhesive surface is configured to allow the dielectric elastomeric actuator to be selectively attached to and detached from a surface of another object, irrespective of a curvature of the surface.

13. The dielectric elastomeric actuator, as set forth in claim 1, wherein the dielectric elastomeric actuator is compliant, such that each of the first section and the second section are configured to deform, while the electrode material layer remains electrically conductive.

14. An actuator comprising:
a first dielectric elastomer actuator (DEA) and a second DEA electrically connected to one another, wherein each of the first and the second DEA includes:
an elastomeric film presenting a first side and a second side, opposing the first side;
wherein the elastomeric film includes a first section, a second section, and a transition section, axially disposed between the first section and the second section;
an electrode material layer disposed on the transition section and at least one of the first section and the second section, on each of the first side and the second side, wherein the electrode material layer includes a movement area and at least two tab areas;
wherein the movement area covers at least a portion of the transition section;
wherein the at least two tab areas extend from the movement area and cover a portion of at least one of the first section and the second section; and
wherein the at least two tab areas on the first side are offset from the at least two tab areas on the second side;
a plurality of conductive strips disposed over at least a portion of a respective tab area, wherein each of the plurality of conductive strips presents an adhesive layer;
wherein the first section and the second section are restrained in a pre-stretched configuration in each of the axial direction and a lateral direction, perpendicular to the axial direction;
wherein the transition section is not restrained in a pre-stretched configuration in the axial direction;
wherein the transition section is configured to elongate in the axial direction in response to the application of a voltage to the electrode material layer, such that the first section and the second section move away from one another, in the axial direction; and
wherein the transition section is configured to contract in the axial direction in an absence of a voltage applied to the electrode material layer, such that the first section and the second section move toward one another, in the axial direction; and
wherein the at least two tab areas of the first DEA are adhesively secured to the corresponding at least two tab areas of the second DEA, by virtue of the respective adhesive layers, such that the at least two tab areas of the first DEA are in electrical contact relationship with the at least two tab areas of the second DEA.

15. The actuator, as set forth in claim 14, wherein the electrode material layer of each of the first DEA and the second DEA has a sufficient density when the elastomeric film is in the pre-stretched configuration, such that the electrode material layer is configured to provide continuous electrical conductivity as the transition section elongates and contracts.

* * * * *